United States Patent [19]

Bergeron et al.

[11] 4,344,222
[45] Aug. 17, 1982

[54] BIPOLAR COMPATIBLE ELECTRICALLY ALTERABLE READ-ONLY MEMORY

[75] Inventors: David L. Bergeron, Winooski; Paul H. Smith, Colchester, both of Vt.

[73] Assignee: IBM Corporation, Armonk, N.Y.

[21] Appl. No.: 199,179

[22] Filed: Oct. 22, 1980

Related U.S. Application Data

[62] Division of Ser. No. 40,805, May 21, 1979, abandoned.

[51] Int. Cl.³ .................. H01L 21/26; H01L 21/28
[52] U.S. Cl. .................................. 29/571; 29/576 B; 29/589; 29/590; 148/1.5; 148/187
[58] Field of Search ............... 29/571, 576 B, 589, 29/590; 148/1.5, 187; 357/23 VT

[56] References Cited

U.S. PATENT DOCUMENTS

| | | | |
|---|---|---|---|
| 3,731,163 | 5/1973 | Shuskus | 357/54 X |
| 3,767,463 | 10/1973 | Aboaf et al. | 357/54 |
| 3,967,981 | 7/1976 | Yamazaki | 148/187 X |
| 4,112,509 | 9/1978 | Wall | 357/54 X |
| 4,135,289 | 1/1979 | Brews | 148/187 X |
| 4,151,537 | 4/1979 | Goldman et al. | 357/23 VT |
| 4,161,039 | 7/1979 | Rossler | 357/23 VT |
| 4,196,441 | 4/1980 | Adam | 357/54 X |
| 4,200,474 | 4/1980 | Morris | 357/23 X |
| 4,203,158 | 5/1980 | Froham-Bentchkowsky et al. | 357/23 VT |

OTHER PUBLICATIONS

Warner et al., *Integrated Circuits*, McGraw-Hill Book Co., N.Y., Apr. 1965, pp. 307-310.

*Primary Examiner*—G. Ozaki
*Attorney, Agent, or Firm*—John E. Hoel

[57] ABSTRACT

A bipolar compatible electrically alterable read-only memory device and process are disclosed based upon the formation of an aluminum gate structure on the surface of a thin oxide layer in an FET precursor device, wherein the aluminum gate structure serves both as an ion-implantation blocking mask for forming self-aligned source and drain regions and, in addition, a source of aluminum for the solid state reaction between the silicon dioxide layer and aluminum, forming an aluminum oxide/silicon dioxide composite charge storage region. The process is wholly compatible with existing bipolar processing technologies so that high speed bipolar support circuitry can be utilized on the same semiconductor chip with the programmable device disclosed. The programmable device disclosed has the unique advantages of having a programming voltage which can be tailored to substantially match the signal voltages on the rest of the chip by controlling the solid state reaction for the aluminum oxide formation step. Lower programming voltages permit more closely spaced device structures and the reduction in the number of power supplies for the resulting chip. Additional process and structural embodiments are disclosed.

9 Claims, 18 Drawing Figures

BEFORE REACTION

AFTER REACTION

BIPOLAR COMPATIBLE ELECTRICALLY ALTERABLE READ-ONLY MEMORY

This is a division of patent application Ser. No. 40,805, filed May 21, 1979, now abandoned in favor of U.S. patent application Ser. No. 270,779 filed June 5, 1981.

FIELD OF THE INVENTION

The invention disclosed broadly relates to semiconductor processes and devices and more particularly relates to electrically alterable storage devices and process for making same.

BACKGROUND OF THE INVENTION

The basis of most electrically alterable, non-volatile, read-only memories (EPROMs) is the ability to store charge on a high-impedance node within a semiconductor device. The presence of the stored charge must be detectable such as by affecting the characteristics of a field effect transistor. The requirement of a high-impedance storage node is dictated by the non-volatility of the device.

Typical storage nodes are: (1) floating gate conductors (such as polysilicon) or (2) non-conducting electrical traps within the device dielectric (such as insulator-insulator interfaces where one insulator is typically $SiO_2$ and the other is another dielectric material such as $Si_3N_4$ or $Al_2O_3$).

In a typical "EPROM," the charge storage node is used to bias the overall MOS structure changing the threshold voltage of the device. The sensitivity of the threshold voltage of the device to changing charge level on the storage node ($Q_T$) can be shown to be proportional to the distance from the metal gate to the traps (for a constant total insulator thickness), or $dV/dQ_T = (-1/\epsilon_0\epsilon_1) X_1$.

FIG. 1 shows a cross-sectional view of a prior art composite layer dielectric charge storage node wherein a first layer 4 of dielectric having a thickness $X_1$, on the surface silicon substrate 2, has deposited thereon a second layer 6 of a dielectric having a thickness $X_2$. The first dielectric layer 4 may be composed of silicon dioxide, for example, and the second dielectric layer 6 may be composed of silicon nitride, for example. The layers have a conductive layer 10 on top of the layer 6 which serves as the programming gate for the composite. It has been found that electrical charges will concentrate at the interface 8 between the lower dielectric layer 4 and the upper dielectric layer 6. Charges may be injected by several prior art techniques such as avalanche injection or tunnel injection so that when the programming gate 10 is properly biased by voltage source 12 with respect to the substrate 2, charges can be added or deleted at the interface 8. When a single diffusion region 3, as in FIG. 1a is juxtaposed with the composite dielectric layers in the silicon substrate 2, a selective capacitance device may be formed. When a first and second diffused regions 5 and 7, as in FIG. 1b, are formed in the silicon substrate 2 which bound the terminal edges of the composite dielectric layers 14, a FET device having a selective transconductance is formed. FIG. 1A illustrates a first tri-storage embodiment with a single diffusion in the substrate and FIG. 1b illustrates a second tri-storage embodiment illustrating the programmable FET device with selective transconductance. The closer the charge storage node 8 is to the silicon surface 2, the less charge must be stored or removed from the charge storage node to change the state of the device. Thus, for devices with the storage node close to the silicon surface, potentially less time is required for programming the device and potentially lower voltages need be employed for that programming.

In a study of the adhesion of aluminum to silicon dioxide, a recent report by J. R. Black, "The Reaction of Al with Vitreous Silica," Paper 8.2 at the 1977 International Reliability Physics Symposium, 4/14/77, described the solid-state reaction between a layer 16 of aluminum and thermal silicon dioxide 18.

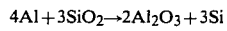

This reaction is thermodynamically favorable at typical sintering temperatures of 400°–500° C. The reaction rate is controlled by solid state diffusion and results in a region 20 within the original oxide 18 extending from the metal-oxide interface 22 being converted from $SiO_2$ to a matrix of $SiO_2$, $Al_2O_3$, and Si as shown in FIGS. 2a and 2b. Because the reaction is diffusion limited, excellent control of the depth of the reaction is possible. As reported by Black, typical rates of penetration range from 0.01 Å/min. at 400° C. to 60 Å/min. at 540° C.

OBJECTS OF THE INVENTION

It is therefore an object of the invention to provide a more accurate placement of a charge storage node in a dielectric layer.

It is another object of the invention to provide a more accurate placement of charge storage traps within a layer of silicon dioxide.

It is yet a further object of the invention to provide improved self-aligned storage and select gates used in semiconductor storage devices.

It is yet another object of the invention to provide a programmable read-only memory having a self-aligned source and drain with respect to its floating gate, in an improved manner.

It is yet a further object of the invention to provide an improved self-aligned source and drain, which alignment is with respect to both the floating gate and the select gate.

It is yet another object of the invention to provide an improved controllable floating gate storage device having improved characteristics.

SUMMARY OF THE INVENTION

These and other objects, features and advantages of the invention are accomplished by the bipolar compatible electrically alterable read-only memory device and method disclosed herein. A bipolar compatible electrically alterable read-only memory device and process are disclosed and based upon the formation of an aluminum gate structure on the surface of a thin oxide layer in an FET precursor device, wherein the aluminum gate structure serves both as an ion implantation blocking mask for forming self-aligned source and drain regions and, in addition, a source of aluminum for the solid state reaction between the silicon dioxide layer and aluminum, forming an aluminum oxide/silicon dioxide composite charge storage region. The process is wholly compatible with existing bipolar processing technologies so that high speed bipolar support circuitry can be utilized on the same semiconductor chip with the programmable device disclosed. The programmable device disclosed has the unique advantages of having a programming voltage which can be tailored to substantially match the signal voltages on the rest of the chip by controlling the solid state reaction for the aluminum oxide formation step. Lower programming voltages permit more closely spaced device structures and the reduction in the number of power supplies for the resulting chip. Additional process and structural embodiments are disclosed.

DESCRIPTION OF THE FIGURES

These and other objects, features and advantages of the invention will be more fully appreciated with reference to the accompanying figures.

FIG. 2b is a resultant stage in the solid state solution process initiated in FIG. 2a.

DISCUSSION OF THE PREFERRED EMBODIMENT

The bipolar compatible electrically alterable read-only memory device and process invention disclosed herein is based upon the inventors' recognition that the solid state reaction disclosed by Black, described above, can be employed in the formation of dual dielectric charge storage nodes and devices. These innovative devices have the unique advantages of having a programming voltage which can be tailored to substantially match the signal voltages on the balance of the chip by controlling the solid state reaction for the aluminum oxide formation step. Lower programming voltages permit more closely spaced device structures and a reduction in the number of power supplies for the resulting chip.

The inventors have recognized that other metals besides aluminum are thermodynamically suitable for the solid state reaction forming their charge storage nodes. Suitable metals which may be substituted for aluminum which was experimented with by Black, described above, must be thermodynamically capable of reducing $SiO_2$ in a reaction forming the metal oxide and silicon as the reaction products under a moderate sintering temperature, which reaction products form a dielectric material whose interface with the host silicon dioxide layer 18 will serve as a suitable electrical charge storage node. Suitable metals include beryllium and titanium which are refractory metals having relatively high melting points. Still another metal which may be substituted for aluminum is magnesium having a relatively more comparable melting point with respect to that for aluminum.

Turning now to the various processes which have been developed by the inventors to produce their inventive charge storage nodes and devices, FIGS. 3a through 3f illustrate a first application.

Figure 1A:
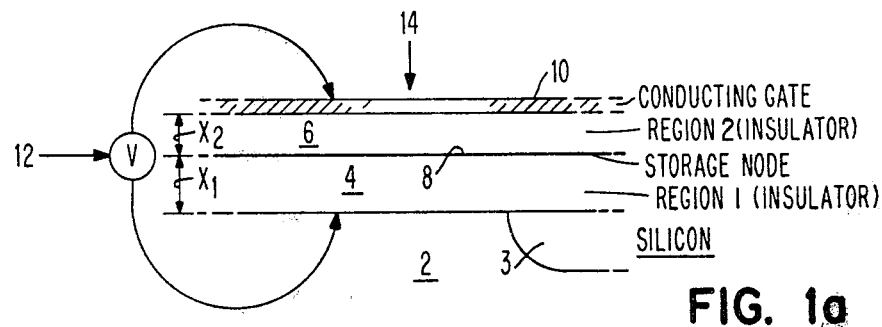
FIG. 1a is a cross-sectional view of a prior art single diffusion dual dielectric storage node device.
Figure 1B:
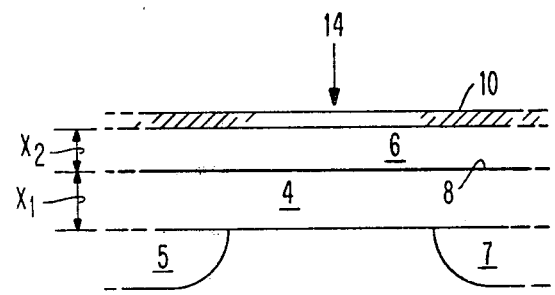
FIG. 1b is a cross-sectional view of a two diffusion embodiment of the storage node device.
Figure 2A:
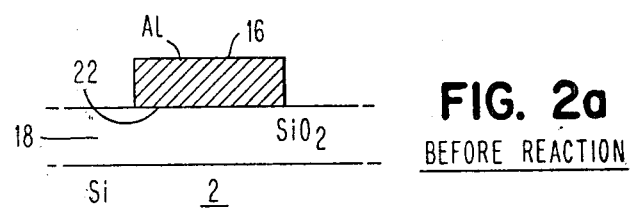
FIG. 2a is a cross-sectional view of a first stage in the solid state reaction between aluminum and silicon dioxide.
Figure 2B:
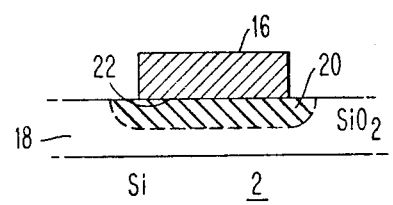
Figure 3A:
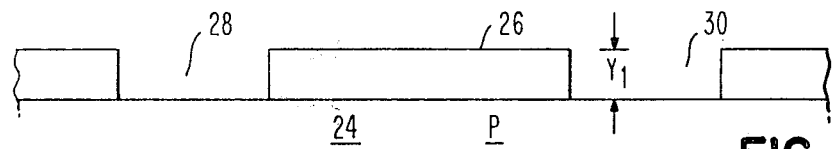
FIGS. 3a through 3f show a sequence of cross-sectional views illustrating a first process embodiment for the invention.

FIG. 3a illustrates the first stage in the first process, where the silicon substrate 24 which can be for example a P-type silicon substrate of from 1-10 ohm centimeters, has formed on the surface thereof a layer of silicon dioxide 26 having a thickness $Y_1$ of approximately 3000 Å. This can be a thermally grown silicon dioxide layer, for example. In the silicon dioxide layer 26 is formed first and second contact windows 28 and 30 which may be formed by standard photolithographic processes.

Figure 3B:
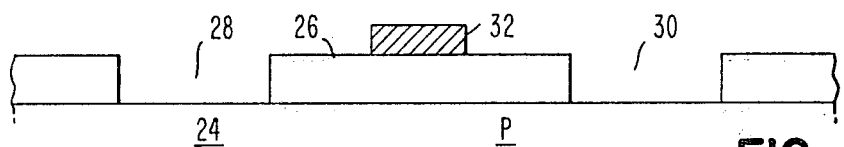
Figure 3C:
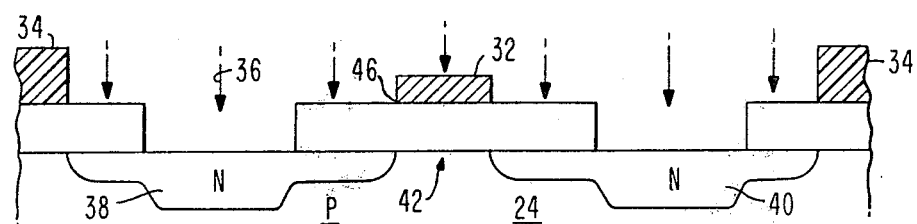

FIG. 3b illustrates a second stage in the first process wherein the aluminum layer 32 having a thickness of approximately 7000 Å is deposited and photolithographically defined on their surface of the silicon dioxide layer 26. Next, FIG. 3c illustrates the deposition of a photoresist layer 34 which serves as an ion-implantation mask, exposing the device region. A high energy, high dose N-type ion-implanation step with the ion 36, typically being phosphorus ions, is performed as is shown in the FIG. 3c. Typically, the beam energy is 300 Kev and the dose level is $5 \times 10^{13}$ to $1 \times 10^{15}$ atoms per square centimeter. This results in ion-implanted source and drain regions 38 and 40 having an N-type conductivity in the P-type substrate 24. The 7000 Å thickness of the aluminum layer 32 has been selected to selectively block out the ion implanation of the ions 36 in the channel region 42 of the device.

Figure 3D:
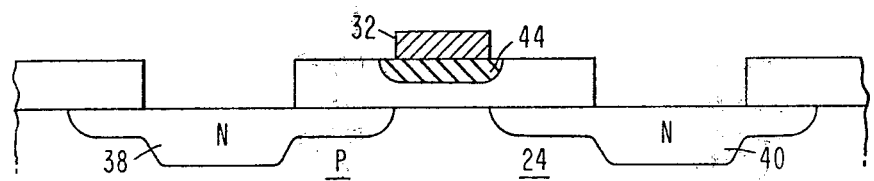

FIG. 3d illustrates the removal of the photoresist layer 34. At this point, the device is inserted into an oven so that the sintering process may take place. As was described above, the sintering process results in a solid state reaction between the aluminum layer 32 and the silicon dioxide layer 26. This reaction is thermodynamically favorable at sintering temperatures of from 400° to 500° C. The reaction rate is controlled by solid state diffusion and results in a region 44 composed of a matrix containing the reaction products $Al_2O_3$ and silicon in the silicon dioxide. This region 44 extends from the original silicon dioxide/aluminum interface 46 down to a depth $Y_3$ into the silicon dioxide layer 26. Because the reaction is diffusion limited, excellent control of the depth $Y_3$ is possible. Typical rates of penetration for the region 44 range from 0.02 Å per minute at 400° C. to 50 Å per minute at 540° C. In a specific example, if the oven is operated at 525° C., then the rate of penetration is approximately 20 Å per minute so that if a 2000 Å penetration distance $Y_3$ is desired, then the sintering operation must be carried out for a duration of 100 minutes. The resulting dimensions in the vertical direction for the charge storage device are: the silicon dioxide layer $Y_1$ is 3000 Å thick, the penetration depth $Y_3$ for the region 44 is 2000 Å, and thus the separation distance between the charge storage node at the interface 48 between the region 44 and the interface between the silicon dioxide layer 26 and silicon substrate 24 is $Y_2 = 1000$ Å.

Figure 3E:
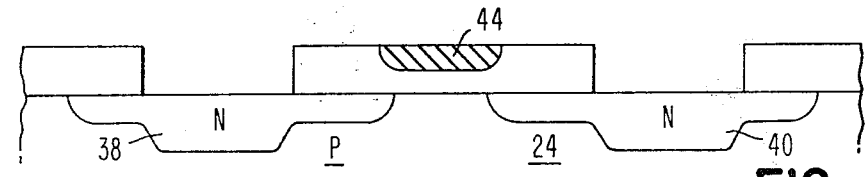

FIG. 3e illustrates the next stage in the process where the device has been removed from the oven and the excess aluminum layer 32 is stripped off in an acid etch. The device is then annealed at a temperature of from 900° to 1100° C. for a duration of approximately 30 minutes so as to convert the interstitial ion-implanted phosphorus atoms in the silicon substrate 24 to substitutional lattice sites to thereby activate the dopant species.

Figure 3F:
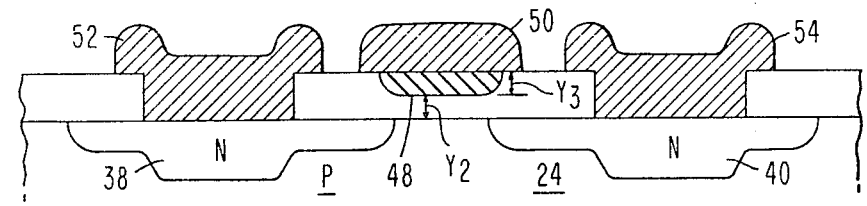

FIG. 3f shows the last stage of the process illustrating the structure of the final device where a second layer of metal 50 is deposited over the region 44 to form the programming gate for the resultant FET programmable device. At the same time the programming gate layer 50 is deposited, metal contacts 52 and 54 are respectively deposited over the ion-implanted regions 38 and 40 to form the source and drain contacts respectively for the finished device. The metal layer 50, 52 and 54 may be aluminum, for example.

The resultant device shown in FIG. 3f may be programmed typically by avalanche injection or by tunneling injection, as is well known in the prior art. The relative quantities of charge stored at the interface 48 between the dielectric region 44 and the silicon dioxide layer 26 govern the relative transconductance of the channel region 42 in the programmable FET device.

The resultant bipolar compatible electrically alterable read-only memory device and method are compatible with aluminum metallurgy bipolar processing where the substrate is N-type and the implanted source and drain are P-type, and therefore enable the simultaneous formation of bipolar support circuitry in decoder circuits, for example, with the FET electrically alterable memory device on the same semiconductor chip. The process does not require the use of a polycrystalline silicon processing operation, and therefore, reduces the number of fabrication steps. The electrically alterable device can have a tailored programming voltage which is created by changing the thickness $Y_1$ of the silicon dioxide layer 26 after the sintering process described with respect to FIG. 3D. This enables the device designer to provide an electrically alterable device which operates with approximately the same voltages as are applied to the balance of the integrated circuit chip. Not only does this reduce the number of power supplies needed, but it also enables a tighter layout to be implemented since lower breakdown voltage devices can be used consistent with the lower programming voltage required. The electrically alterable read-only device has a self-aligned storage node, the interface 48, with respect to the channel region 42 between the source and drain regions 38 and 40. This enables a tighter photolithographic tolerance to be applied in the layout of the chip.

An alternative device can be fabricated using either of two alternative processes shown respectively in the FIGS. 4a–4d and 5a–5d. The alternate device features self-alignment of both the storage node and the select or programming gates to the source and drains.

Figure 4A:
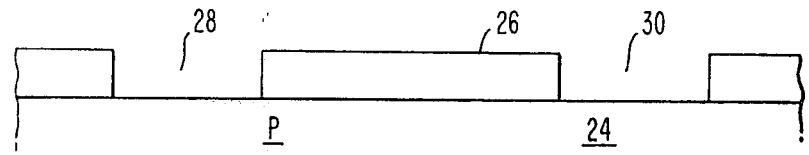
FIGS. 4a through 4d illustrate a sequence of cross-sectional views illustrating a second embodiment for the process invention.
Figure 4B:
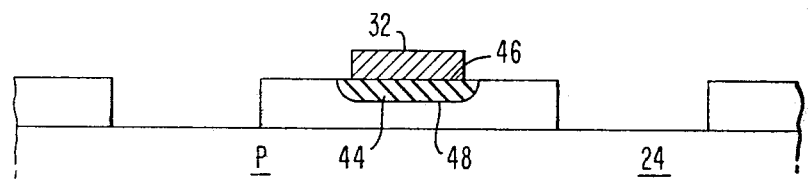

FIGS. 4a–4d illustrate a second process embodiment wherein the metal layer 32 is a refractory metal which can withstand the ion implantation annealing step and will also reduce silicon dioxide. FIG. 4a corresponds to FIG. 3a. FIG. 4b corresponds to FIG. 3b wherein a refractory metal such as titanium or beryllium may be substituted for the aluminum disclosed with respect to FIG. 3b. Metal 32 serves as both the implantation mask for the subsequent ion-implantation step of FIG. 4c as well as the ultimate programming gate for the device. The sintering step is carried out in FIG. 4b in a manner similar to that for FIG. 3d. The solid-state reaction in the refractory metal 32 and the silicon dioxide can be carried out at a suitable sintering temperature, for example from 400 to approximately 500° C. The reaction rate is controlled by the solid state diffusion and results in a region 44 shown in FIG. 4b within the original silicon dioxide layer 26, having a composition of the reaction products, namely the metal oxide and the reduced silicon, and the reactant silicon dioxide. The resultant metal oxide/silicon dioxide interface 48 penetrates a distance $Y_3$ which is proportional to the duration of the sintering process, at the particular temperature employed.

Figure 4C:
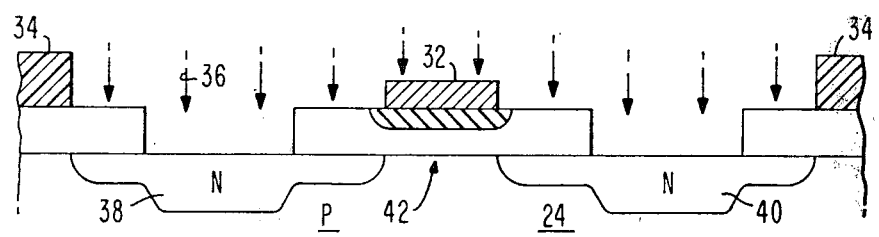

FIG. 4c illustrates the next step which is the deposition of a photoresist layer 34 used to define the ion-implanted regions 38 and 40 which will ultimately be the source and drain of the programmable FET device. The thickness of the refractory metal layer 32 is selected to be thick enough to effectively mask the ion implantation of the ions 36 from the channel region 42 between the source and drain 38 and 40 which are being formed. Once again, the ionic species can be phosphorus and the ion-implantation process carried out at the same parameters used in FIG. 3c, described above.

Figure 4D:
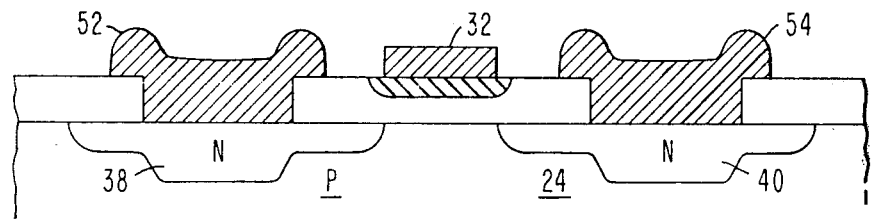

FIG. 4d illustrates the final structure for the device produced by the process wherein contact metal layers 52 and 54 are deposited so as to contact the source and drain regions 38 and 40, respectively.

In addition to the advantages recited for the device produced by the process of FIGS. 3a–3f, the device shown in FIG. 4d has the additional advantage that the charge storage interface 48 is self-aligned with respect to both the programming gate 32 and with respect to the channel region 42 between the source and drain 38 and 40. This further enhances the density and performance advantages which are proved through the device shown in FIG. 3f.

Figure 5A:
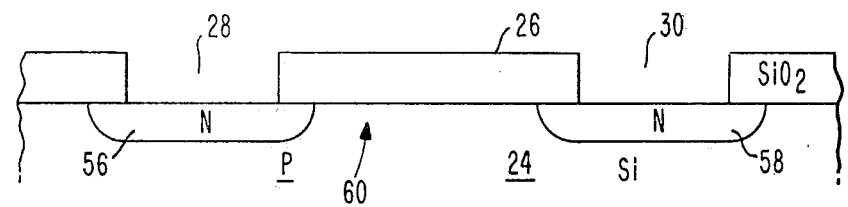
FIGS. 5a through 5d illustrate a sequence of cross-sectional views illustrating a third embodiment of the process invention.
Figure 5B:
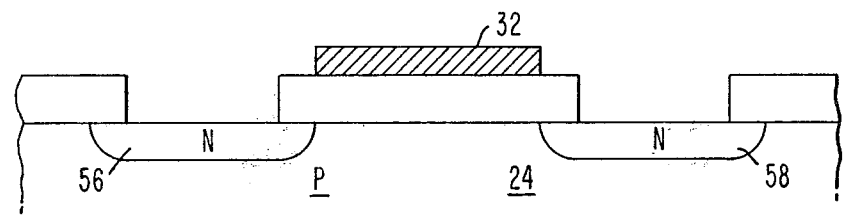

FIGS. 5a–5d show a third embodiment of the process invention wherein the metal layer 32 is deposited after the formation of the source and drain regions 56 and 58. As is seen in FIG. 5a, the N-type source and drain regions 56 and 58 are formed in the P-type substrate 24, leaving a channel region 60 there between. These regions are formed prior to the deposition of the metal layer 32 which is shown in FIG. 5b. The source and drain regions 56 and 58 may be formed by any of a number of prior art techniques including thermal diffusion or ion implantation.

Figure 5C:
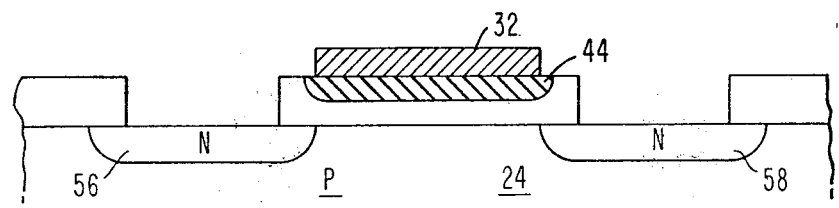
Figure 5D:
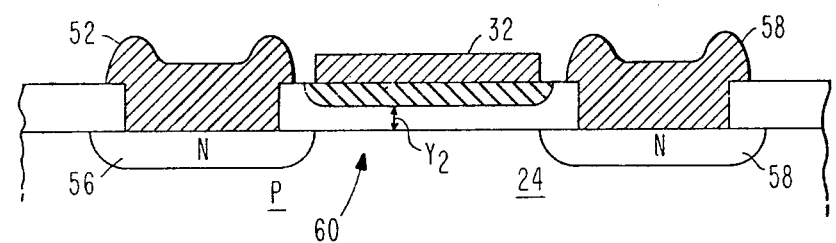

FIG. 5c illustrates the step of sintering the metal layer 32 so as to form the solid state reaction described above generating the region 44 having the charge storage interface 48 with respect to the silicon dioxide layer 26. FIG. 5d illustrates the final step and structure of this embodiment of the device (contact metal 52 and 54 is deposited connecting the source and drain regions 56 and 58). In this embodiment, the programming gate 32 may be either a nonrefractory metal such as aluminum or magnesium as described above or a refractory metal such as beryllium or titanium as described above since the metal layer 32 is not exposed to any subsequent high temperature step.

This embodiment has the advantages of a self-alignment between the storage interface 48 and the programming gate 32 but does not have a self-alignment feature of either the programming gate 32 or the charge storage interface 48 with respect to the channel region 60 between the source and drain regions 56 and 58.

The bipolar compatible electrically alterable read-only memory device and method are compatible with aluminum metallurgy bipolar processing, and therefore, enable the simultaneous formation of bipolar support circuitry in decoder circuits, for example, with the FET electrically alterable memory device on the same semiconductor chip. The process does not require the use of polysilicon processing, and therefore, reduces the number of fabrication steps. The electrically alterable device can have a tailored programming voltage which is created by changing the thickness of the silicon dioxide layer remaining after the sintering process. This enables the designer to provide an electrically alterable device which operates with approximately the same voltages as are applied to the balance of the integrated circuit chip. Not only does this reduce the number of power supplies needed but it enables a tighter layout to be implemented since the possibility of dielectric breakdown between adjacent conductive structures is reduced with the lower programming voltage required. The electrically alterable read-only device has a self-aligned storage node with respect to the source and drain regions which enables a tighter photolithographic tolerance to be applied in the layout of the chip.

While the invention has been particularly shown and described with reference to the preferred embodiment thereof, it will be understood by those skilled in the art that the foregoing and other changes in form and details may be made therein without departing from the spirit and the scope of the invention.

Having thus described our invention, what we claim as new, and desire to secure by Letters Patent is:

1. A process for forming an electrically alterable charge storage node on a semiconductor substrate of a first conductivity type, having a silicon dioxide insulating layer on the surface of the substrate, comprising the steps of:

depositing a first layer of metal on the surface of said silicon dioxide layer, having a thickness which, in combination with the thickness of the silicon dioxide layer, will serve to mask a subsequent ion-implantation step;

ion implanting a conductivity enhancing impurity of a second conductivity type through said silicon dioxide layer adjacent to said metal layer, to form an ion-implanted region having a terminal portion aligned with the edge of said metal;

sintering said metal layer to initiate a solid state reaction between said metal and said silicon dioxide layer, forming a metal oxide charge storage region in said silicon dioxide layer which is substantially aligned with said terminal portion of said ion-implanted region and said metal layer;

stripping said metal layer; and depositing a second metal layer over said metal oxide charge storage region, as a programming gate for said electrically alterable storage node;

whereby an electrically alterable charge storage node is formed.

2. The process of claim 1, which further comprises:

forming a second ion-implanted region simultaneously with the formation of said first ion-implanted region on the side of said metal layer opposite from said first ion-implanted region, having a terminal edge aligned with said opposite side of said metal layer;

whereby said first and second ion-implanted regions serve as the source and drain regions of an electrically programmable field effect transistor device.

3. The process of claim 2, wherein said metal is selected from the group consisting of beryllium and titanium.

4. The process of claim 2, wherein said metal is selected from the group consisting of aluminum and magnesium.

5. The process of claim 2, which further comprises:

after said sintering step, the step of stripping said metal layer;

annealing said ion-implanted layer; and depositing a second metal layer over said metal oxide layer, as a programming gate for said electrically programmable field effect transistor.

6. A process for forming an electrically alterable charge storage node on a semiconductor substrate of a first conductivity type, having a silicon dioxide insulating layer on the surface of the substrate, comprising the steps of:

depositing a layer of aluminum on the surface of said silicon dioxide layer, having a thickness which, in combination with the thickness of the silicon dioxide layer, will serve to mask a subsequent ion-implantation step;

ion implanting a conductivity enhancing impurity of a second conductivity type through said silicon dioxide layer adjacent to said aluminum layer, to form an ion-implanted region having a terminal portion aligned with the edge of said aluminum;

sintering said aluminum layer to initiate a solid state reaction between said aluminum and said silicon dioxide layer, forming a metal oxide charge storage region in said silicon dioxide layer which is substantially aligned with said terminal portion of said ion-implanted region and said aluminum layer;

stripping said aluminum layer; and depositing a second metal over said metal oxide charge storage region, as a programming gate for said electrically alterable storage node;

whereby an electrically alterable charge storage node is formed.

7. A process for forming an electrically programmable field effect transistor device on a semiconductor substrate of a first conductivity type, having a silicon dioxide insulating layer on the surface of the substrate, comprising the steps of:

depositing a layer of aluminum on the surface of said silicon dioxide layer, having a thickness which, in combination with the thickness of the silicon dioxide layer, will serve to mask a subsequent ion-implantation step;

ion implanting a conductivity enhancing impurity of a second conductivity type through said silicon dioxide layer adjacent to said aluminum layer, to form an ion-implanted source region having a terminal portion aligned with a first edge of said aluminum layer and an ion-implanted drain region having a terminal portion aligned with a second edge of said aluminum layer opposite from said first edge;

sintering said aluminum layer to initiate a solid state reaction between said aluminum and said silicon dioxide layer, forming a metal oxide charge storage region in said silicon dioxide layer which is substantially aligned with said terminal portions of said ion-implanted source and drain regions and said first and second edges, respectively, of said aluminum layer;

stripping said aluminum layer; and depositing a second metal layer over said metal oxide charge storage region, as a programming gate for said electrically programmable field effect transistor;

whereby an electrically programmable field effect transistor device is formed.

8. A process for forming an electrically programmable field effect transistor device on a semiconductor substrate of a first conductivity type, having a silicon dioxide insulating layer on the surface of the substrate, comprising the steps of:

depositing a layer of a refractory metal selected from the group consisting of titanium and beryllium, on the surface of said silicon dioxide layer, said metal layer being patterned to have first and second opposed edges, and having a thickness which, in combination with the thickness of the silicon dioxide layer, will serve to mask a subsequent ion-implantation step;

sintering said refractory metal layer to initiate a solid state reaction between said refractory metal and said silicon dioxide layer, forming a metal oxide charge storage region in said silicon dioxide layer which is substantially aligned with said first and second edges of said refractory metal layer; and ion implanting a conductivity enhancing impurity of a second conductivity type through said silicon dioxide layer adjacent to said refractory metal layer, to form an ion-implanted source region having a terminal portion aligned with said first edge of said refractory metal layer and an ion-implanted drain region having a terminal portion aligned with said second edge of said refractory metal layer;

said refractory metal layer serving as a programming gate for the electrically programmable field effect transistor device thereby formed.

9. A process for forming an electrically programmable field effect transistor device on a semiconductor substrate of a first conductivity type, having a silicon dioxide insulating layer on the surface of the substrate and a source and drain region of a second conductivity type separated by a channel region in said substrate, comprising the steps of:

depositing a layer of metal selected from the group consisting of aluminum, magnesium, beryllium, and titanium, on the surface of said silicon dioxide layer, said metal layer being patterned to have first and second opposed edges;

sintering said metal layer to initiate a solid state reaction between said metal and said silicon dioxide layer, and forming a metal oxide charge storage region in said silicon dioxide layer which is substantially aligned with said first and second edges of said metal layer;

said metal layer serving as a programming gate for the electrically programmable field effect transistor device thereby formed.

* * * * *